US011616019B2

(12) United States Patent
Qiu et al.

(10) Patent No.: US 11,616,019 B2
(45) Date of Patent: Mar. 28, 2023

(54) SEMICONDUCTOR ASSEMBLY

(71) Applicant: NVIDIA Corp., Santa Clara, CA (US)

(72) Inventors: Jacky Qiu, Shenzhen (CN); Martin Ding, Shenzhen (CN); Jerry Zhou, Shenzhen (CN); Minto Zheng, Shenzhen (CN)

(73) Assignee: NVIDIA Corp., Santa Clara, CA (US)

( * ) Notice: Subject to any disclaimer, the term of this patent is extended or adjusted under 35 U.S.C. 154(b) by 207 days.

(21) Appl. No.: 17/128,597

(22) Filed: Dec. 21, 2020

(65) Prior Publication Data

US 2022/0199528 A1    Jun. 23, 2022

(51) Int. Cl.
| | |
|---|---|
| *H01L 23/13* | (2006.01) |
| *H01L 23/14* | (2006.01) |
| *H01L 23/42* | (2006.01) |
| *H01L 23/60* | (2006.01) |
| *H01L 23/66* | (2006.01) |
| *H01L 23/367* | (2006.01) |

(Continued)

(52) U.S. Cl.
CPC .......... *H01L 23/5286* (2013.01); *H01L 23/14* (2013.01); *H01L 23/367* (2013.01); *H01L 23/5223* (2013.01); *H05K 1/0215* (2013.01); *H05K 1/119* (2013.01); *H05K 7/20009* (2013.01)

(58) Field of Classification Search
CPC ........ H05K 1/111; H05K 1/119; H05K 1/141; H05K 1/144; H05K 1/0215; H05K 1/0216; H05K 1/0231; H05K 3/341; H05K 3/368; H05K 7/1092; H05K 7/20009; H01L 23/13; H01L 23/14; H01L 23/42; H01L 23/60; H01L 23/66; H01L 23/147; H01L 23/367; H01L 23/481; H01L 23/5223; H01L 23/5286; H01L 24/00; H01L 24/02; H01L 24/09; H01L 24/14; H01L 24/16; H01L 24/17; H01L 24/24; H01L 24/48; H01L 24/49; H01L 24/73; H01L 25/16; H01L 25/18
USPC .... 361/753, 220, 760, 803; 257/40, 48, 532, 257/659, 666, 676, 737, 750, 774, 777, 257/784
See application file for complete search history.

(56) References Cited

U.S. PATENT DOCUMENTS

| | | |
|---|---|---|
| 5,127,837 A | 7/1992 | Shah et al. |
| 5,272,599 A | 12/1993 | Koenen |

(Continued)

FOREIGN PATENT DOCUMENTS

TW    I260488 B    8/2006

OTHER PUBLICATIONS

Johnson, "10 Reasons Why I Love the BGA," as downloaded from www.sigcon.com/Pubs/straight/gba.htm on Oct. 13, 2020.

(Continued)

*Primary Examiner* — Xiaoliang Chen (57) ABSTRACT

A semiconductor assembly is described that includes a substrate having top and bottom sides. An integrated circuit die coupled to the substrate includes first and second distinct sets of ground pads. In some embodiments, the first and second sets of ground pads are configured to have distinct ground return paths to a host system. In further embodiments, one of the ground return paths may include a metal plate coupled between ground contacts on the top side of the substrate and ground contacts on a printed circuit board of the host system.

28 Claims, 8 Drawing Sheets

(51) Int. Cl.
  *H01L 25/16*   (2023.01)
  *H01L 25/18*   (2023.01)
  *H01L 23/528*  (2006.01)
  *H05K 1/02*    (2006.01)
  *H05K 7/20*    (2006.01)
  *H05K 1/11*    (2006.01)
  *H01L 23/522*  (2006.01)

(56) References Cited

U.S. PATENT DOCUMENTS

| | | | |
|---|---|---|---|
| 6,534,391 B1 | 3/2003 | Huemoeller et al. | |
| 7,091,586 B2 | 8/2006 | Millik et al. | |
| 7,102,892 B2 | 9/2006 | Kledzik et al. | |
| 9,674,954 B2 | 6/2017 | Swaminathan et al. | |
| 9,716,051 B2 | 7/2017 | Zhang et al. | |
| 9,831,189 B2 | 11/2017 | Zhang | |
| 9,831,225 B2 | 11/2017 | Shinh et al. | |
| 10,658,300 B2* | 5/2020 | Kim | H01L 23/5384 |
| 10,757,812 B1 | 8/2020 | Cai et al. | |
| 2003/0156400 A1* | 8/2003 | Dibene, II | H01R 12/7088 |
| | | | 257/E23.09 |
| 2004/0021139 A1* | 2/2004 | Jackson | H01L 25/50 |
| | | | 257/E21.597 |
| 2005/0136635 A1* | 6/2005 | Savastiouk | H01L 23/5384 |
| | | | 257/E23.172 |
| 2006/0076681 A1 | 4/2006 | Tsao et al. | |
| 2006/0170112 A1* | 8/2006 | Tanaka | H01L 24/05 |
| | | | 257/777 |
| 2007/0259480 A1* | 11/2007 | Sundstrom | H05K 3/341 |
| | | | 257/E21.511 |
| 2008/0179740 A1 | 7/2008 | Liao | |
| 2008/0211068 A1* | 9/2008 | Chen | H01L 24/14 |
| | | | 257/E23.036 |
| 2008/0290486 A1* | 11/2008 | Chen | H01L 24/14 |
| | | | 257/676 |
| 2009/0080135 A1* | 3/2009 | Major | H01L 23/60 |
| | | | 29/829 |
| 2010/0327439 A1* | 12/2010 | Hwang | H01L 24/73 |
| | | | 257/737 |
| 2011/0156224 A1* | 6/2011 | Rokuhara | H01L 23/552 |
| | | | 257/659 |
| 2012/0248439 A1* | 10/2012 | Lee | H01L 23/49838 |
| | | | 257/777 |
| 2013/0063843 A1* | 3/2013 | Chen | H01L 23/552 |
| | | | 361/56 |
| 2014/0097547 A1* | 4/2014 | Kuroda | H01L 25/0657 |
| | | | 257/777 |
| 2014/0115199 A1* | 4/2014 | Yoshikawa | G06F 13/287 |
| | | | 710/51 |
| 2014/0167292 A1* | 6/2014 | Masumura | H01L 24/48 |
| | | | 257/784 |
| 2015/0108604 A1* | 4/2015 | Nakamura | H01L 24/17 |
| | | | 257/532 |
| 2015/0115466 A1* | 4/2015 | Kim | H01L 23/3121 |
| | | | 257/774 |
| 2015/0237731 A1* | 8/2015 | Toyama | H05K 1/0231 |
| | | | 361/760 |
| 2016/0079169 A1* | 3/2016 | Uzoh | H01L 21/76838 |
| | | | 257/750 |
| 2016/0104659 A1* | 4/2016 | Park | H01L 23/49838 |
| | | | 257/774 |
| 2017/0207205 A1* | 7/2017 | Kim | H01L 24/20 |
| 2017/0213776 A1* | 7/2017 | Oikawa | H01L 25/0655 |
| 2018/0047696 A1* | 2/2018 | Yamada | H01L 23/49827 |
| 2018/0158771 A1* | 6/2018 | Akiba | H01L 23/528 |
| 2018/0158772 A1* | 6/2018 | Tanaka | H01L 25/16 |
| 2018/0331036 A1* | 11/2018 | Zhang | H05K 1/0219 |
| 2018/0331043 A1* | 11/2018 | Zhang | H01L 24/00 |
| 2018/0342467 A1* | 11/2018 | Lim | H01L 28/20 |
| 2018/0374788 A1* | 12/2018 | Nakagawa | H01L 25/18 |
| 2019/0244905 A1* | 8/2019 | Yu | H01L 25/0652 |
| 2019/0287951 A1* | 9/2019 | Kim | H01L 24/96 |
| 2019/0304875 A1* | 10/2019 | Yokoyama | H01L 25/0657 |
| 2019/0304936 A1* | 10/2019 | Shaul | H01L 25/16 |
| 2019/0318990 A1* | 10/2019 | Nakagawa | H01L 24/17 |
| 2019/0363157 A1* | 11/2019 | Karashima | H01L 24/17 |
| 2019/0385977 A1* | 12/2019 | Elsherbini | H01L 25/16 |
| 2020/0066641 A1* | 2/2020 | Aygun | H01L 23/50 |
| 2020/0091128 A1* | 3/2020 | Elsherbini | H01L 24/17 |
| 2020/0098621 A1* | 3/2020 | Bharath | H01L 23/13 |
| 2020/0098692 A1* | 3/2020 | Liff | H01L 23/5386 |
| 2020/0211927 A1* | 7/2020 | Wan | H01L 21/4882 |
| 2020/0219815 A1* | 7/2020 | Elsherbini | H01L 23/5385 |
| 2020/0219816 A1* | 7/2020 | Aleksov | H01L 23/49811 |
| 2020/0227377 A1* | 7/2020 | Liff | H01L 24/09 |
| 2020/0227384 A1* | 7/2020 | Liff | H01L 25/0655 |
| 2020/0227401 A1* | 7/2020 | Elsherbini | H01L 24/83 |
| 2020/0273839 A1* | 8/2020 | Elsherbini | H01L 23/49822 |
| 2020/0273840 A1* | 8/2020 | Elsherbini | H01L 23/42 |
| 2021/0159166 A1* | 5/2021 | Oikawa | H01L 23/528 |
| 2022/0068845 A1* | 3/2022 | Chen | H01L 23/04 |

OTHER PUBLICATIONS

Actel, "Ceramic Chip Carrier Land Grid (CC256) Package," (Actel Corp., Oct. 2003).
Jaeger, Introduction to Microelectronic Fabrication, Second Edition, Chapter 8, "Packaging and Yield," (Prentice Hall, 2001).
Chelsea Technology, Inc., "Ceramic Pin Grid Array Packages," as downloaded from www.chelseatech.com/packages.htm on Oct. 30, 2020.
He, et al., "System-in-Package: Electrical and Layout Perspectives" (Foundations and Trends in Electronic Design Automation, vol. 4, No. 4 (2011).
Clark, "IC Package Design's Effects on Signal Integrity," (Fairchild Semiconductor, 2003).
Intel, "An Introduction to Plastic Pin Grid Array (PPGA) Packaging," (Intel Copropration, 1996).
Iorga, "Power Integrity and Noise Coupling in Integrated Circuits Design Project," (UCLA, 2020).
Stack Exchange, "How Are BGA Dies Constructed?" as downloaded from electronics.stackexchange.com/questions/70292/how-are-bga-dies-constructed on Oct. 13, 2020.
Texas Instruments, "Ceramic Pin Grid Array (CPGA)" (Texas Instruments Incorporated, 2011).
Wikipedia, "Flip Chip" as downloaded from en.wikipedia.org/wiki/Flip_chip on Oct. 29, 2020.
Kuang, et al., "Chip Carrier Package as an Alternative for Known Good Die," (MAPLD International Conference, Washington, D.C., Sep. 8-10, 2004).
Wikipedia.org, "Pin Grid Array," (downloaded Dec. 21, 2020 from en.wikipedia.org/wiki/Pin_grid_array).

* cited by examiner

SEMICONDUCTOR ASSEMBLY

BACKGROUND

Modern integrated circuit chips and multi-chip systems pose a number of packaging challenges for designers. One such challenge relates to the number of electrical connections that must be located on the exterior of the chip package. As chip technology has developed, the quantity of on-chip circuitry has increased dramatically. This has been especially true for central processing unit ("CPU") and graphics processing unit ("GPU") designs, for example. The increased quantity of on-chip circuitry has caused a commensurate increase in the number of external connections that must be provided on the chip package so that the on-chip circuitry can be interfaced with the surrounding circuitry of a host system in which the chip package will be deployed. Packaging techniques have developed accordingly, such that modern CPU and GPU packages include a substrate on which an integrated circuit die is mounted. A rectangular grid or array of connecting points is typically provided on the bottom side of the substrate to connect the circuitry of the integrated circuit die with the circuitry of the host system. Examples of such grids or arrays of connecting points include pin grid arrays ("PGA"), ball grid arrays ("BGA"), land grid arrays ("LGA") and the like. A substrate has a larger area than does an integrated circuit die, so inclusion of a substrate in the chip package makes more space available to accommodate the relatively large PGA pins, BGA solder balls, or LGA contact pads that must be placed on the package. A large substrate, however, occupies a large area of the host printed circuit board ("PCB") on which the substrate is mounted. This, in turn, constrains space available on the host PCB for placement of the many other components that are required by the host system. In addition, the high concentration of connecting points on the bottom of the substrate results in a high routing density for signals in the area of the PCB over which the substrate is mounted. The high routing density often requires adding layers to the host PCB, which increases both its cost and its complexity.

A second packaging challenge relates to signal integrity. As the density of connecting points on a chip packages becomes higher, the distance between adjacent connecting points on the package becomes smaller. Consequently, the risk of unwanted signal coupling increases—especially as frequencies increase in the signals that are routed through the connecting points. Even when coupling noise can be addressed successfully, however, transient voltage drops associated with individual switching signals remain as a separate problem. Signals that switch with fast edge rates ("fast slew rate" signals) are associated with higher changes in current per unit time ("di/dt") at the switching edges than are signals that switch with slower edge rates. This is true regardless of the frequency at which they switch. Moreover, the current path associated with any switching signal presents an inductance, L. Any switching signal will therefore produce a transient voltage drop across this inductance in an amount proportional to its di/dt, since the voltage across an inductor, $V_L$, is equal to the product of the inductance and the di/dt. In other words, $V_L=L*di/dt$. To compensate, designers place decoupling capacitors in close proximity to switching circuits in order to absorb the transients by supplying short-term current demand with a nearby charge, thereby reducing the associated voltage drop on the signal path and improving signal integrity. Specifically, designers place the decoupling capacitors in close proximity to the integrated circuit die where the switching circuitry resides. Decoupling capacitors can be very large, however, compared to the size of an integrated circuit die. Placement of the decoupling capacitors has therefore become increasingly problematic because the area in close proximity to the integrated circuit die is already dense with PCB traces, pins, solder balls or contact pads.

A third packaging challenge relates to heat dissipation. A modern CPU or GPU can dissipate well over 100 Watts of power across a die area measuring less than half of one square inch. This produces a tremendous amount of heat density, which requires efficient heat dissipation techniques in order to maintain die temperatures within safe operating limits.

BRIEF DESCRIPTION OF THE DRAWINGS

Various techniques and apparatus that beneficially address the above and other challenges will be described below with reference to the following drawings, in which like reference numbers generally denote like or similar elements.

DETAILED DESCRIPTION

This disclosure describes multiple embodiments by way of example and illustration. It is intended that characteristics and features of all described embodiments may be combined in any manner consistent with the teachings, suggestions and objectives contained herein. Thus, phrases such as "in an embodiment," "in one embodiment," and the like, when used to describe embodiments in a particular context, are not intended to limit the described characteristics or features only to the embodiments appearing in that context.

The phrases "based on" or "based at least in part on" refer to one or more inputs that can be used directly or indirectly in making some determination or in performing some computation. Use of those phrases herein is not intended to foreclose using additional or other inputs in making the described determination or in performing the described computation. Rather, determinations or computations so described may be based either solely on the referenced inputs or on those inputs as well as others. The phrase "configured to" as used herein means that the referenced item, when operated, can perform the described function. In this sense an item can be "configured to" perform a function even when the item is not operating and is therefore not currently performing the function. Use of the phrase "configured to" herein does not necessarily mean that the described item has been modified in some way relative to a previous state. "Coupled" as used herein refers to a connection between items. Such a connection can be direct or can be indirect through connections with other intermediate items. Terms used herein such as "including," "comprising," and their variants, mean "including but not limited to." Articles of speech such as "a," "an," and "the" as used herein are intended to serve as singular as well as plural references except where the context clearly indicates otherwise.

Figure 1:
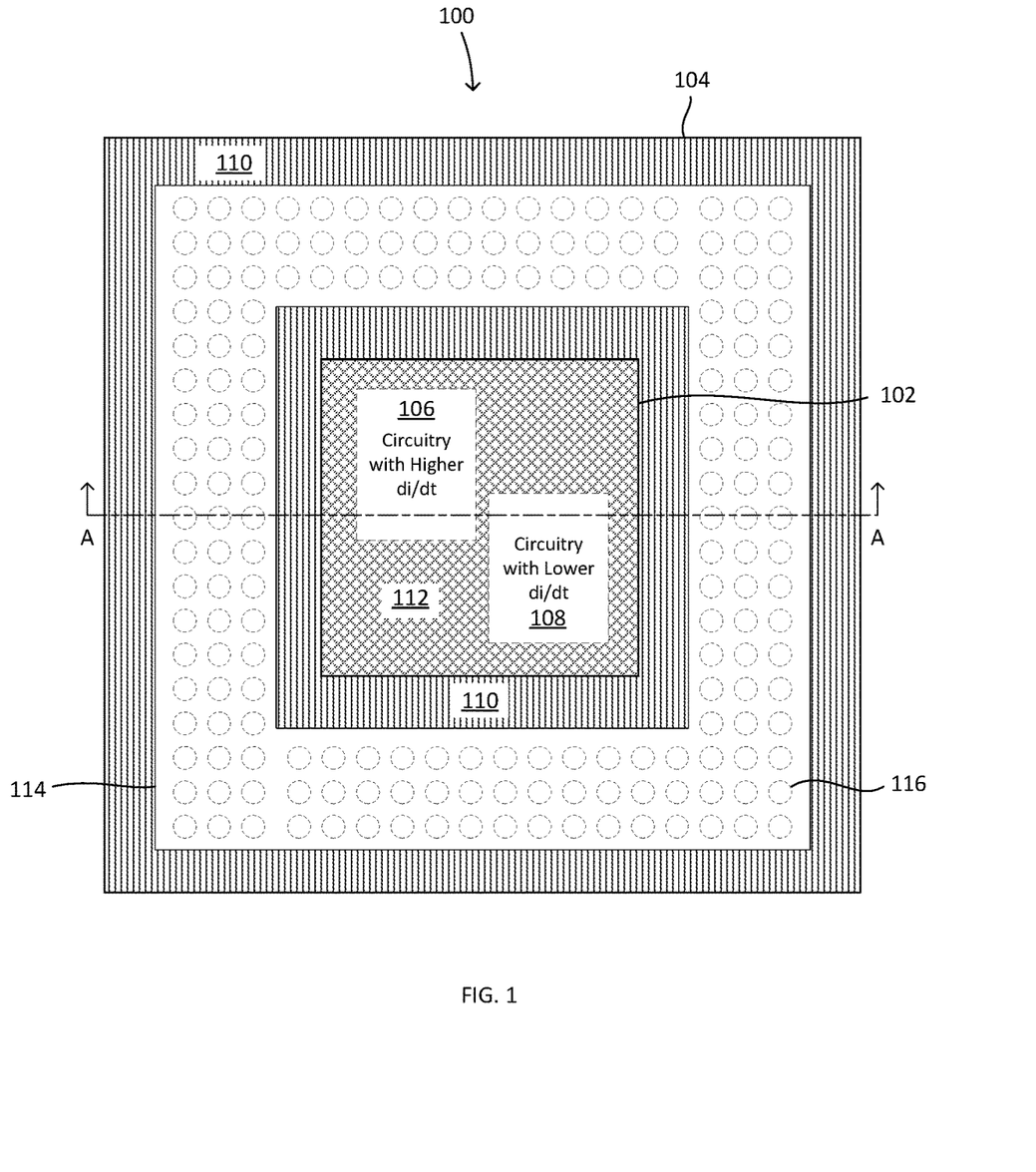
FIG. 1 is a plan view schematically illustrating an example integrated circuit die on a substrate in accordance with embodiments.

FIG. 1 is a plan view diagram schematically illustrating of a semiconductor assembly 100 in accordance with example embodiments. Assembly 100 includes an integrated circuit die 102 coupled to a substrate 104. As will be further described below with reference to FIGS. 2-5, in many embodiments a protective cover or over-mold covers die 102. The protective cover or over-mold is omitted in FIG. 1 to illustrate die 102 more clearly. Materials and production techniques used to construct die 102 and substrate 104 may include any known materials and techniques, which may vary in accordance with numerous factors including, for example, cost, performance, and intended application environments for assembly 100. Typically, die 102 may be manufactured from a silicon wafer according to known integrated circuit processing techniques, and substrate 104 may be manufactured from various components such as fiberglass-reinforced printed circuit board ("PCB") material, ceramic dielectric sheets, molded resin, organic build-up layers, and the like.

As shown in the drawing, integrated circuit die 102 may include circuitry 106 that exhibits higher di/dt (i.e., faster switching edge rates) and circuitry 108 that exhibits lower di/dt (i.e., slower switching edge rates relative to those corresponding to circuitry 106). A non-limiting example of circuitry that may exhibit slower edge rates, and thus lower di/dt, would be off-chip input/output signals. A non-limiting example of circuitry that may exhibit faster edge rates, and thus higher di/dt, would be processing stages within a CPU or GPU core. Although the diagram shows circuitry 106 and 108 in distinct areas of die 102, this is only for purposes of illustration and clarity. In embodiments, elements that make up circuitry 106 and 108 may in general be disposed at any locations on die 102 and may be distributed across several different regions, which regions may themselves be overlapping or distinct, contiguous or fragmented.

The top side surface area of substrate 104 is larger than that of die 102, such that die 102 does not cover the entire top surface of substrate 104. In particular, a first region 110 of substrate 104 (shown in the drawing with a vertical line pattern) is not covered by die 102, while a second region 112 of substrate 104 (shown in the drawing with a crosshatch pattern) is covered by die 102.

At least one electrically conductive element 114 is located in region 110 on the top side of substrate 104. Conductive element 114 may take a variety of forms including, for example, one or more exposed portions of a conductive layer disposed within or near the surface of substrate 104, or one or more separate conductive elements attached to the top side of substrate 104. In the embodiment shown in FIG. 1, conductive element 114 comprises a continuous region of exposed metal such as copper extending around the circumference of die 102 on the top side of substrate 104. In other embodiments both the number of conductive elements 114 and their form or material may vary. For example, in some embodiments, the area of substrate 104 occupied by conductive element 114 may extend all the way to one or more edges of the top surface of substrate 104. In some embodiments, substrate 104 may have a generally rectangular (including, potentially, square) shape, and either a single contiguous or multiple discrete conductive elements 114 may be disposed adjacent to each of the four sides of substrate 104. In any embodiments, conductive element(s) 114 may include, or may consist of, one or more recesses or pins 116 configured to make electrical contact with corresponding pins or recesses on a separate conductor that is designed to mate with, or otherwise be coupled to, conductive element 114. Pins or recesses 116, if used, may themselves take a variety of shapes and forms. For example, they may be formed integrally with substrate 104 or may comprise discrete components that are coupled to substrate 104.

FIGS. 2-5 are sectional views, taken generally along section A-A indicated in FIG. 1, illustrating several example embodiments of semiconductor assembly 100. Embodiments 200-500 are provided by way of example and not limitation. Other embodiments are also possible and will be apparent to persons having skill in the art having reference to the example embodiments and to the remainder of this disclosure. In each of the figures, a protective die cover or over-mold 203 is shown covering the integrated circuit die 102. In some embodiments, the die cover may be formed from a thermally conductive material such as metal, and the void between the bottom surface of the cover and the adjacent surface of the integrated circuit die may be filled with any of several known materials that are thermally conductive but electrically non-conductive. It should be noted that the word "die" as used throughout this disclosure and the appended claims refers interchangeably either to a protective cover 203, to an integrated circuit die 102, or to both.

Each of embodiments 200-500 includes one or more electrically conductive elements 114 located on a top side 218, 318, 418, 518 of a substrate 204, 304, 404, 504. For embodiments in which protective cover 203 will extend over a portion of conductive elements 114 on the top side of the substrate, as shown in FIGS. 3 and 5, an electrically insulating layer 301, 501 may be interposed between protective cover 203 and elements 114, if desired. Each of embodiments 200-500 also includes one or more electrically conductive elements 220, 320, 420, 520 located on a bottom side 222, 322, 422, 522 of the corresponding substrate 204, 304, 404, 504. Although electrically conductive elements 220, 320, 420, 520 are shown in FIGS. 2-5 as solder balls, as they would appear in a BGA package, in other embodiments these elements may take other forms, such as pins in a PGA package or lands in an LGA package. In the illustrated embodiments, only a few such conductive elements are shown on the bottom of each substrate so as not to unduly complicate the drawings. In actual embodiments, more of such conductive elements will typically be present. In each of embodiments 200-500, the bottom side 222, 322, 422, 522 of the substrate 204, 302, 404, 504 is configured to face a PCB. Methods for coupling the substrate to the PCB will be discussed further below with reference to FIGS. 6-8.

In each of embodiments 200-500, integrated circuit die 102 may be coupled to the corresponding substrate using any of a variety of known techniques. In embodiments 200 and 400, for example, die 102 is shown coupled to the corresponding substrate in "flip chip" fashion. According to the flip chip technique, the integrated circuit die is mounted face down onto the substrate so that connecting pads on the face of the integrated circuit die may be coupled to electrical contacts in or on the substrate by means of solder balls or fused connection points 205, 405. In embodiments 300 and 500, die 102 is shown coupled to the corresponding substrate in "wire bonding" fashion. According to the wire bonding technique, the integrated circuit die is mounted face up on the substrate so that connecting pads on the face of the integrated circuit die may be coupled to electrical contacts in or on the substrate by means of bonding wires such as those illustrated at 305, 505. Other die mounting techniques may also be used. Regardless of the mounting technique employed, connecting pads on die 102 will be electrically connected to corresponding electrical contacts in or on the corresponding substrate ("substrate contacts"). Only a few such connecting pads and substrate contacts are shown in FIGS. 2-5 so as not to unduly complicate the drawings. In actual embodiments, more of such connecting pads and substrate contacts will typically be present.

Figure 2:
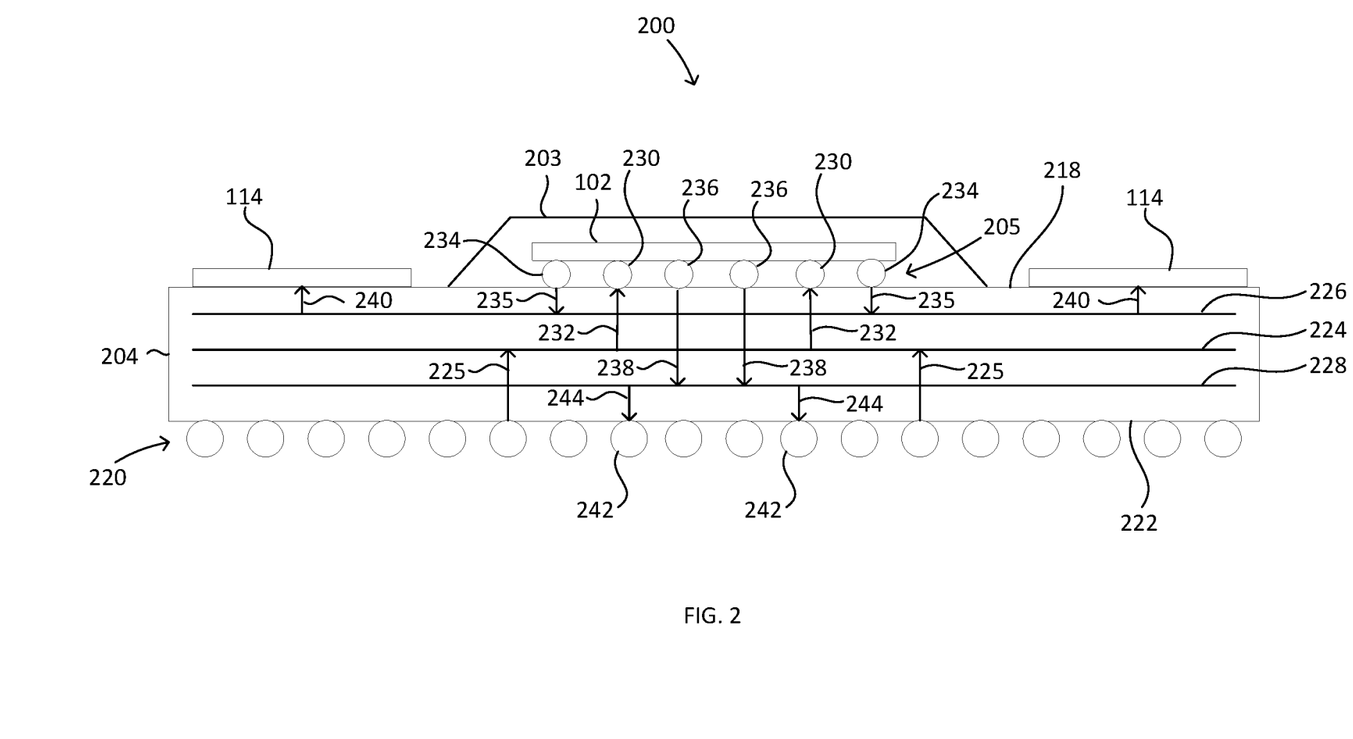
FIGS. 2-5 are cross-sectional views illustrating the integrated circuit die and substrate of FIG. 1 in accordance with several example classes of embodiments.
Figure 3:
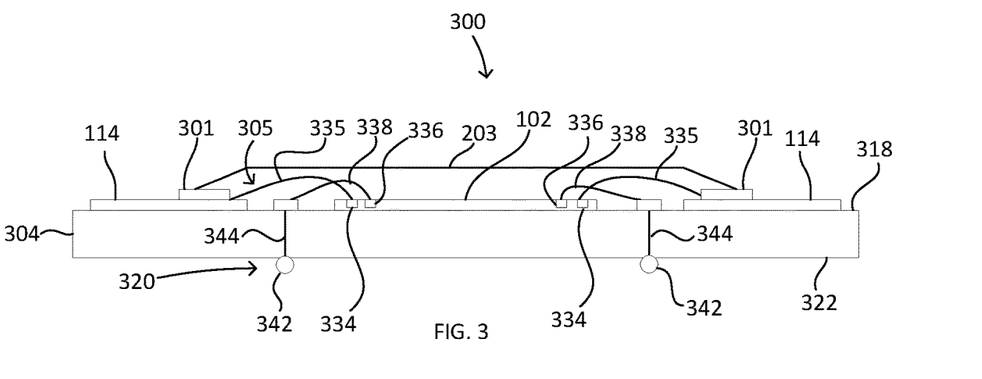

Referring now to FIG. 2, substrate 204 of embodiment 200 includes a power plane 224 and ground planes 226, 228. In embodiment 200, ground planes 226 and 228 are not electrically connected to one another inside of substrate 204. Power plane 224 is shown between ground planes 226, 228. In other embodiments, power plane 224 may be located elsewhere and may not be between ground planes 226, 228. Supply voltage is coupled to power plane 224 from a host system through vias 225 formed inside substrate 204, and to connecting pads 230 on the die through vias 232. Die 102 includes two distinct sets of ground pads 234, 236. One set of ground pads, 234, is coupled to ground plane 226 through vias 235. The other set of ground pads, 236, is coupled to ground plane 228 through vias 238. Ground plane 226 is coupled to conductive element 114 on the top side of substrate 204 through vias 240. Ground plane 228 is coupled to conductive elements 242 on the bottom side of substrate 204 through vias 244. By virtue of these connections, the first and second sets of ground pads, 234, 236 on die 102 of embodiment 200 are configured to have distinct ground return paths to the host system. Specifically, the first set of ground pads, 234, is electrically connected to substrate contact(s) 114 on the top side of the substrate by a first ground path that includes vias 235, ground plane 226, and vias 240. The second set of ground pads, 236, is electrically connected to substrate contacts 242 on the bottom side of the substrate by a second ground path that includes vias 238, ground plane 228, and vias 244. Thus, the ground pads in first set, 234, have a ground return path to the host system that passes exclusively through substrate contact(s) 114 on the top side of substrate 204, while the ground pads in the second set, 236, have a ground return path to the host system that passes exclusively through substrate contacts 242 on the bottom side of substrate 204.

Embodiment 300, illustrated in FIG. 3, is analogous to embodiment 200 except for the method of mounting the die to the substrate. As was the case for embodiment 200, die 102 of embodiment 300 includes two distinct sets of ground pads 334, 336, and the two sets of ground pads are configured to have distinct ground return paths to the host system. One set of ground pads, 334, is electrically connected to substrate contact(s) 114 on the top side 318 of substrate 304 through wire bonds 335. The other set of ground pads, 336, is electrically connected to substrate contacts 342 on the bottom side 322 of substrate 304 through wire bonds 338 and vias 344. Thus, the ground pads in first set, 334, have a ground return path to the host system that passes exclusively through substrate contact(s) 114 on the top side of substrate 304, while the ground pads in the second set, 336, have a ground return path to the host system that passes exclusively through substrate contacts 342 on the bottom side of substrate 304. Connecting points and routing planes for power supply and other signals are not shown in FIG. 3 so as not to unduly complicate the drawing.

Note that, in embodiment 200, both distinct ground return paths to the host system pass through the interior of the substrate. In embodiment 300, however, only one of the two distinct ground return paths to the host system passes through the interior of the substrate. The latter arrangement may be of benefit not only with the wire bonding technique but also with other die mounting techniques in which the connecting pads of the die are upward facing relative to the mounting surface of the substrate.

Figure 4:
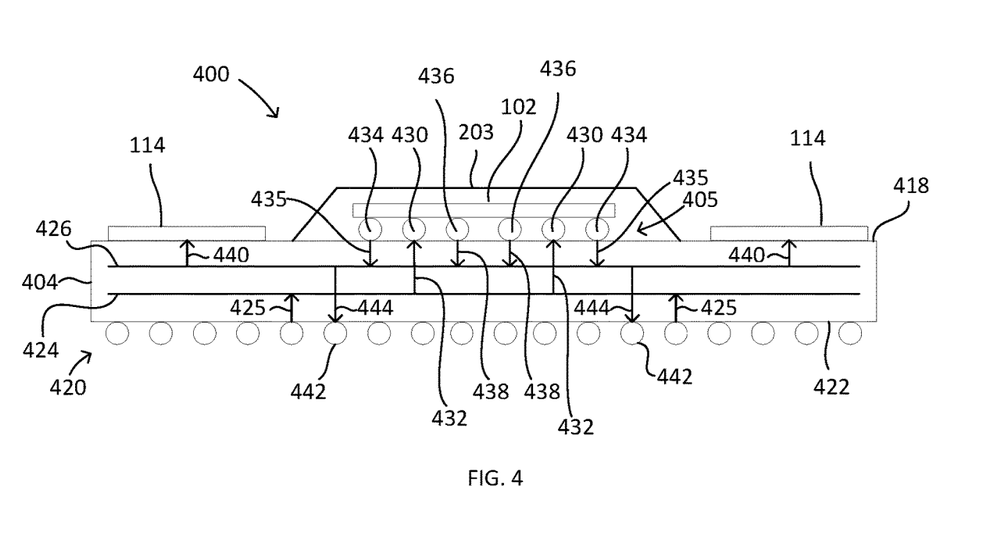
Figure 5:
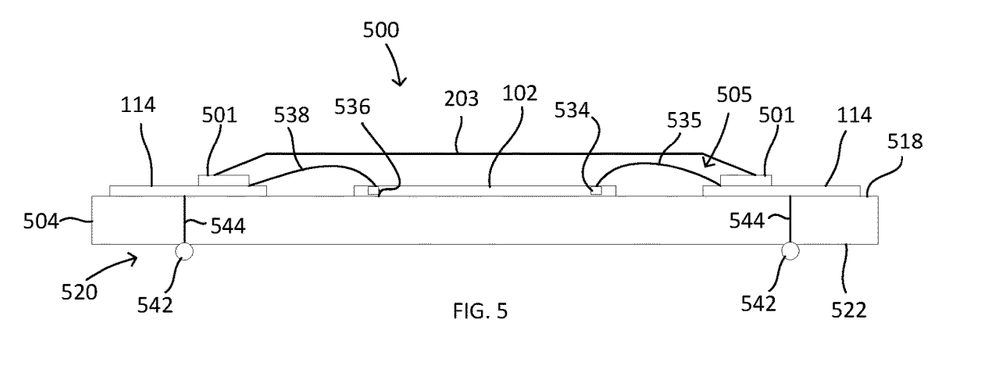

Referring now to FIG. 4, substrate 404 of embodiment 400 includes a power plane 424 and a ground plane 426. Supply voltage is coupled to power plane 424 from a host system through vias 425 formed inside substrate 204, and to connecting pads 430 on the die through vias 432. Power plane 424 is shown below ground plane 426 in the illustrated embodiment. In other embodiments, power plane 424 may be located elsewhere and may not be below ground plane 426. Die 102 includes two distinct sets of ground pads 434, 436. One set of ground pads, 434, is coupled to ground plane 426 through vias 435. The other set of ground pads, 436, is coupled to ground plane 426 through vias 438. In embodiment 400, ground plane 426 is electrically connected both to substrate contact(s) 114 on the top side 418 of substrate 404, through vias 440, and to substrate contacts 442 on the bottom side 422 of substrate 404, through vias 444.

Embodiment 500, illustrated in FIG. 5, is analogous to embodiment 400 except for the method of mounting the die to the substrate. As was the case for embodiment 400, die 102 of embodiment 500 includes two distinct sets of ground pads 534, 536. In embodiment 500, both sets of ground pads, 534, 536, are electrically connected both to substrate contact(s) 114 on the top side 518 of substrate 504, through wire bonds 535, 538, and to substrate contacts 542 on the bottom side 522 of substrate 504, through vias 544. Connecting points and routing planes for power supply and other signals are not shown in FIG. 5 so as not to unduly complicate the drawing.

Figure 6:
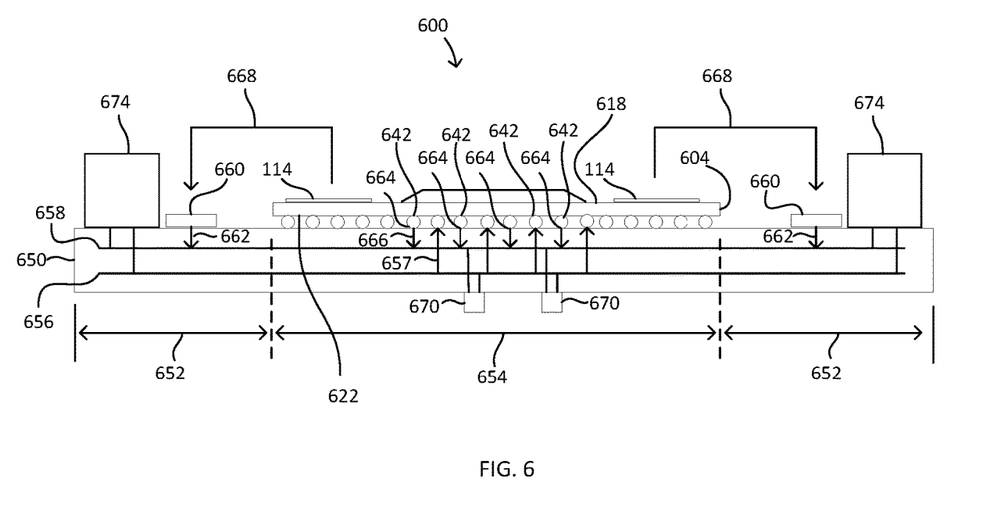
FIGS. 6-8 are cross-sectional views illustrating any of the integrated circuit die and substrate arrangements of FIGS. 1-5 coupled to a host system in accordance with several example classes of embodiments.
Figure 7:
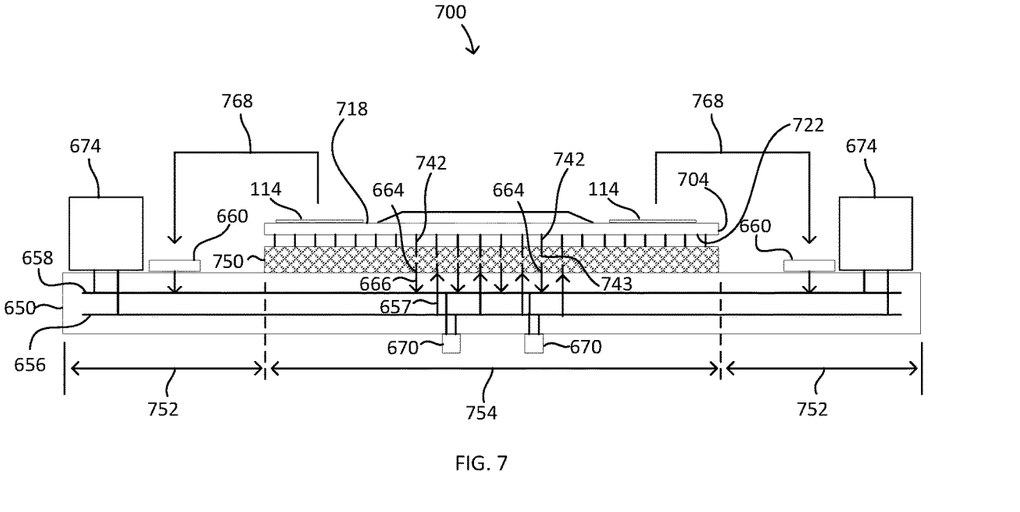
Figure 8:
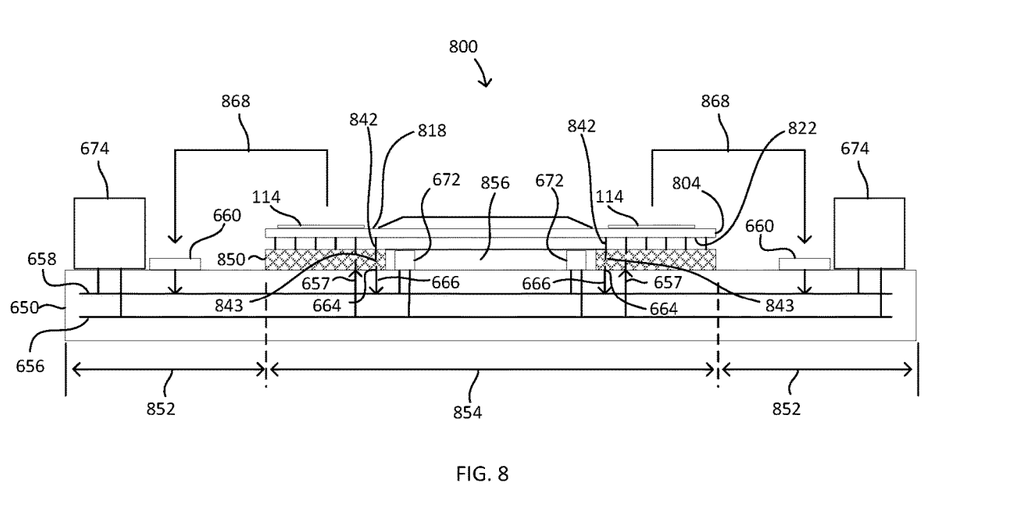

FIGS. 6-8 illustrate various example methods for mounting any of the semiconductor assemblies described above to a PCB of a host system.

Embodiment 600, illustrated in FIG. 6, shows a BGA substrate 604 coupled directly to a PCB 650 such that the bottom side 622 of the substrate faces PCB 650. The area of PCB 650 is larger than that of substrate 604, such that a first region 652 of PCB 650 is not covered by substrate 604. Substrate 604 covers only a second region 654 of PCB 650. PCB 650 includes a power plane 656 and a ground plane 658. (In embodiments, the relative locations of power plane 656 and ground plane 658 may vary.) Power plane 656 is coupled to power connections on substrate 604 through vias 657. A first set of PCB ground contacts 660 is located in the first region 652 of PCB 650 and is coupled to ground plane 658 through vias 662. A second set of PCB ground contacts 664 is located in the second region 654 of PCB 650 and is coupled to ground plane 658 through vias 666. As persons having skill in the art will readily appreciate, ground plane 658 constitutes a PCB ground node. At least one first electrically conductive path 668 is coupled between PCB ground contacts 660 and conductive elements 114 on the top side 618 of substrate 604. At least one second electrically conductive path is coupled between PCB ground contacts 664 and conductive elements 642 on the bottom side 622 of substrate 604. In embodiment 600, these second electrically conductive paths comprise the solder balls that are disposed between substrate 604 and PCB ground contacts 664.

In embodiment 700, illustrated in FIG. 7, a substrate 704 is coupled to PCB 650 by means of a PGA or LGA socket 750 such that the bottom side 722 of substrate 704 faces PCB 650. As was the case in embodiment 600, the area of PCB 650 is larger than that of substrate 704, such that a first region 752 of PCB 650 is not covered by substrate 704. Substrate 704 covers only a second region 754 of PCB 650. At least one first electrically conductive path 768 is coupled between PCB ground contacts 660 and conductive elements 114 on the top side 718 of substrate 704. At least one second electrically conductive path is coupled between PCB ground contacts 664 and conductive elements 742 on the bottom side 722 of substrate 704. In embodiment 700, these second electrically conductive paths comprise the conductors 743 in socket 750, as shown.

In embodiment 800, illustrated in FIG. 8, a substrate 804 is coupled to PCB 650 by means of a PGA or LGA socket 850 such that the bottom side 822 of substrate 804 faces PCB 650. Socket 850 is of the type that leaves a void 856 underneath substrate 804. As was the case in embodiments 600 and 700, the area of PCB 650 is larger than that of substrate 804, such that a first region 852 of PCB 650 is not covered by substrate 804. Substrate 804 covers only a second region 854 of PCB 650. At least one first electrically conductive path 868 is coupled between PCB ground contacts 660 and conductive elements 114 on the top side 818 of substrate 804. At least one second electrically conductive path is coupled between PCB ground contacts 664 and conductive elements 842 on the bottom side 822 of substrate 804. As was the case in embodiment 700, in embodiment 800 these second electrically conductive paths comprise the conductors 843 in socket 850, as shown.

Note that, in each of example embodiments 600-800, PCB ground contacts 664 are configured to be located underneath the substrate when the substrate is coupled to PCB 650. Thus, in each embodiment, the second electrically conductive paths are very short—comprising just the solder balls under the substrate in embodiment 600 and just the conductors inside the sockets in embodiments 700 and 800. The first electrically conductive paths 668, 768, 868 in these embodiments are longer than the second electrically conductive paths, because the distance between substrate contacts 114 and PCB ground contacts 660 is longer in each embodiment than is the distance between the bottom sides of substrates 604, 704, 804 and the adjacent surface of PCB 650 on which PCB ground contacts 664 are formed.

In some embodiments, therefore, the ground pads on die 102 that are in the first set, 234, 334, 434, 534, correspond to the circuitry 108 on die 102 that has the lower di/dt, while the ground pads on die 102 that are in the second set, 236, 336, 436, 536, correspond to the circuitry 106 on die 102 that has the higher di/dt. Thus, in such embodiments, the circuitry 106 with higher di/dt has a shorter ground return path to the host system of PCB 650 than does the circuitry 108 with the lower di/dt.

Also note that, in each of example embodiments 600-800, one or more sets of off-chip decoupling capacitors may be placed on PCB 650 in advantageous locations. Specifically, off-chip decoupling capacitors 670, 672 may be placed under the substrate in regions 654, 754, 854 of PCB 650, while potentially larger off-chip decoupling capacitors 674 may be placed in regions 652, 752, 852 of PCB 650 where more space is available. (The phrase "under the substrate" as used herein and in the appended claims refers to regions 654, 754, 854 and includes the locations shown for capacitors 670, which are on the opposite side of PCB 650 from the substrate, as well as the locations shown for capacitors 672, which are on the same side of PCB 650 as the substrate.) In such embodiments, off-chip decoupling capacitors 670, 672 may be associated with circuitry 106 with higher di/dt, either because they are located proximate to a host system ground return path that is exclusive to circuitry 106, or because they are located proximate to ground contacts 664 to which circuitry 106 is connected, or both. Similarly, decoupling capacitors 674 may be associated with circuitry 108 with lower di/dt, either because they are located proximate to a host system ground return path that is exclusive to circuitry 108, or because they are located proximate to ground contacts 660 to which circuitry 108 is connected, or both. In either case, decoupling capacitors 670, 672 may generally be located closer to die 102 than decoupling capacitors 674, because capacitors 670, 672 are located in region 654 under the substrate (in some embodiments, even under the die area itself), whereas capacitors 674 are located in region 652, which in most embodiments will be farther from the die area. Decoupling capacitors need not be present in all embodiments. In some embodiments, only one or the other type of decoupling capacitors, such as 670 and/or 672, or such as 674, may be present.

In embodiments generally, electrically conductive paths 668, 768, 868 may take any of a variety of forms including, for example, wires or cables. In a more particular class of embodiments, conductive paths 668, 768, 868 may take the form of one or more metal plates.

Figure 9:
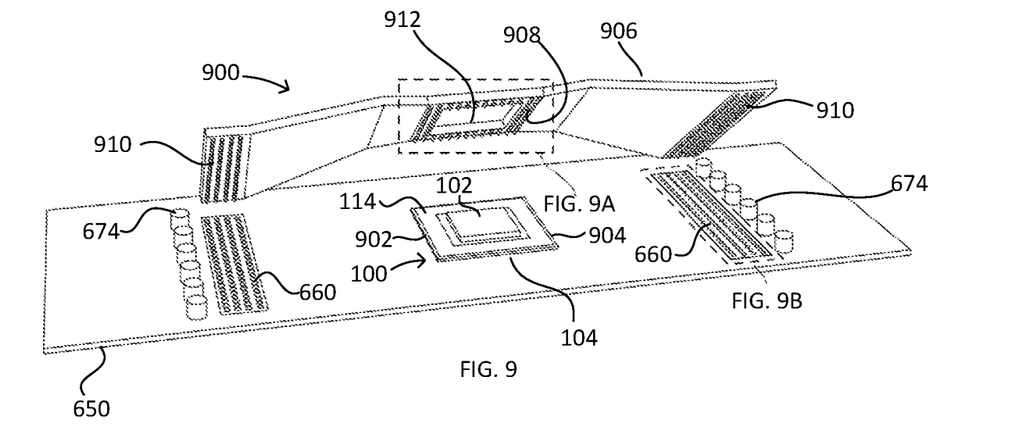
FIG. 9 is an exploded perspective view illustrating any of the arrangements of FIGS. 1-8 together with first example PCB ground contacts and a first example metal plate in accordance embodiments.
Figure 9A:
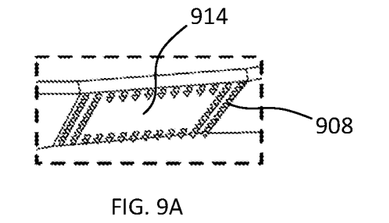
FIG. 9A is a close-up perspective view illustrating a portion of a second example metal plate in accordance with embodiments.
Figure 9B:
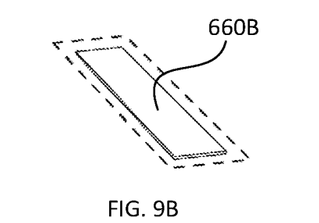
FIG. 9B is a close-up perspective view illustrating a second example PCB ground contact in accordance with embodiments.

An example of one such embodiment is shown in FIG. 9. In FIG. 9, a system 900 includes a semiconductor assembly 100 coupled to a PCB 650 in accordance with any of the above-described techniques. PCB ground contacts 660 are shown disposed in first and second locations of PCB 650 adjacent opposite ends 902, 904 of substrate 104. Metal plate 906 is configured to extend over at least part of region 110 of substrate 104 and at least part of region 652, 752, 852 of PCB 650. Metal plate 906 is further configured to make electrical contact, when installed, with both of PCB ground contacts 660 and with substrate contact(s) 114. Because metal plate 906 is itself electrically conductive, it may constitute any of conductive paths 668, 768, 868. In the embodiment shown, metal plate 906 is configured to make electrical contact with substrate contact(s) 114, and with PCB ground contacts 660, by means of plural electrically conductive pins 908, 910. In such embodiments, substrate contact(s) 114 and/or PCB ground contacts 660 may be configured with corresponding recesses to receive the pins on metal plate 906. In other embodiments, the contact areas on the metal plate, on the substrate, and/or on the PCB may be configured without pins. For example, FIG. 9B illustrates a variation 660B of PCB ground contacts 660 in which the contact area comprises simply a continuous, smooth conductive surface. Other contact types may also be used.

Figure 10:
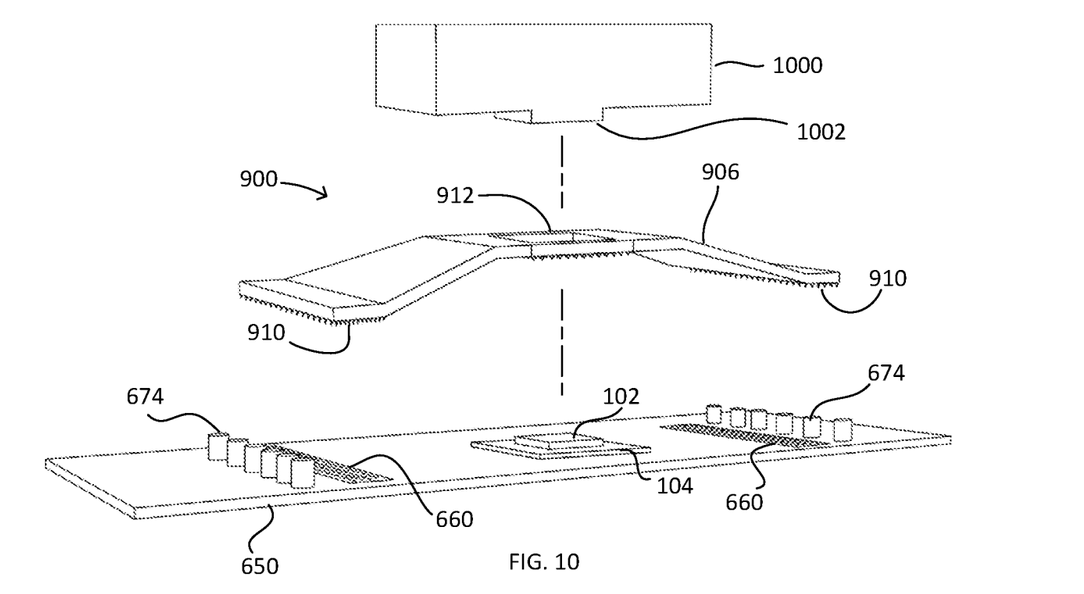
FIG. 10 is an exploded perspective view illustrating a first example cooler together with the first example metal plate arrangement of FIG. 9 in accordance with embodiments.

In system 900, metal plate 906 defines an opening 912 that is configured to expose the upward facing side of die 102 after the plate is installed on PCB 650 over semiconductor assembly 100. In some embodiments, opening 912 may facilitate thermal management of assembly 100. Referring now to FIG. 10, a cooler 1000 is shown in exploded view over system 900. Cooler 1000 is configured to be mounted over opening 912 such that a thermally conductive path is established through opening 912 between cooler 1000 and the upward facing side of die 102. In some embodiments, the thermally conductive path may include a portion 1002 of cooler 1000 that extends through opening 912 and contacts the die 102.

Figure 11:
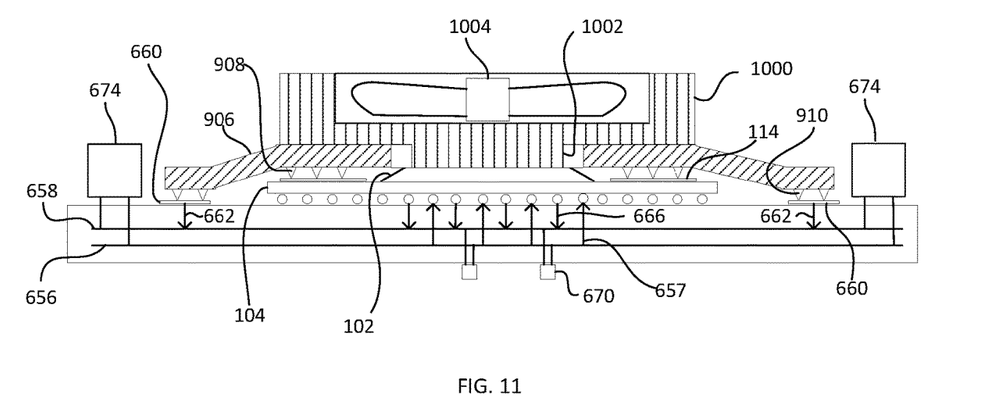
FIG. 11 is an assembled cross-sectional view of the arrangement of FIG. 10.

FIG. 11 presents an assembled sectional view of the arrangement illustrated in FIG. 10. As can be seen in this view, a portion 1002 of cooler 1000 extends through opening 912 of metal plate 906 such that thermal communication is established between cooler 1000 and the upward facing side of die 102. In other embodiments, the upward facing side of die 102 may extend through opening 912 such that it contacts the bottom side of cooler 1000, eliminating the need for portion 1002 of cooler 1000 that extends through the opening.

Figure 12:
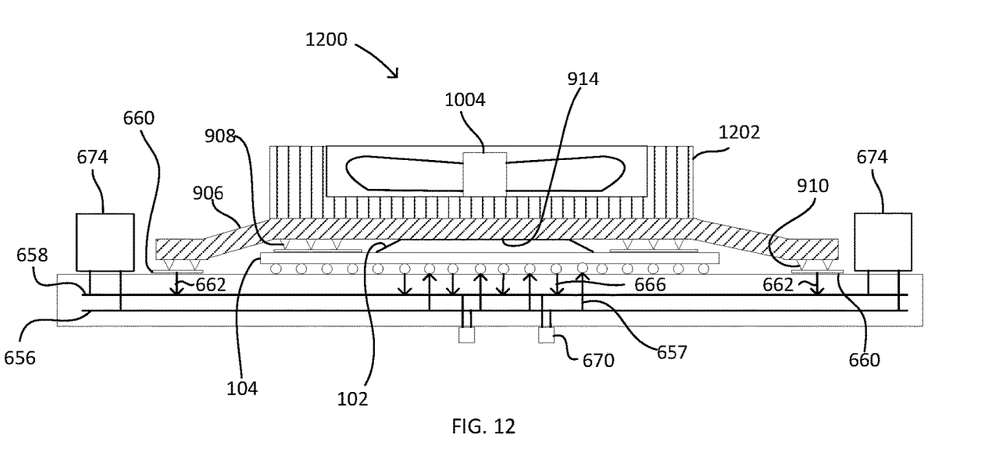
FIG. 12 is an assembled cross-sectional view illustrating a second example cooler together with the second example metal plate arrangement of FIG. 9 in accordance with embodiments.

Referring again to FIG. 9, in some embodiments, metal plate 906 may not include an opening 912. Such an embodiment is illustrated in FIG. 9A, in which area 914 of metal plate 906 is continuous with the rest of metal plate 906. FIG. 12 presents an assembled sectional view illustrating embodiments of this type. As can be seen in this view, metal plate 906 in system 1200 covers substantially all of the upward facing side of die 102 and is in thermal communication with die 102 by virtue of physical contact between portion 914 of plate 906 and the upward facing side of die 102. In other embodiments, a similar result may be achieved using a metal plate that covers less than substantially all of the upward facing side of die 102. A cooler 1202 may be mounted over the metal plate such that a thermally conductive path is established between cooler 1200 and the upward facing side of die 102 through metal plate 906.

In embodiments, coolers 1000, 1202 may take a wide variety of forms. For example, cooler 1000, 1202 may be a passive heat dissipation device such as a simple heat sink, or cooler 1000, 1202 may be an active heat dissipation device that includes one or more active elements such as a fan 1004, as shown, or such as a liquid cooling system. The number of cooling elements and their spatial orientations may also vary.

Figure 13:
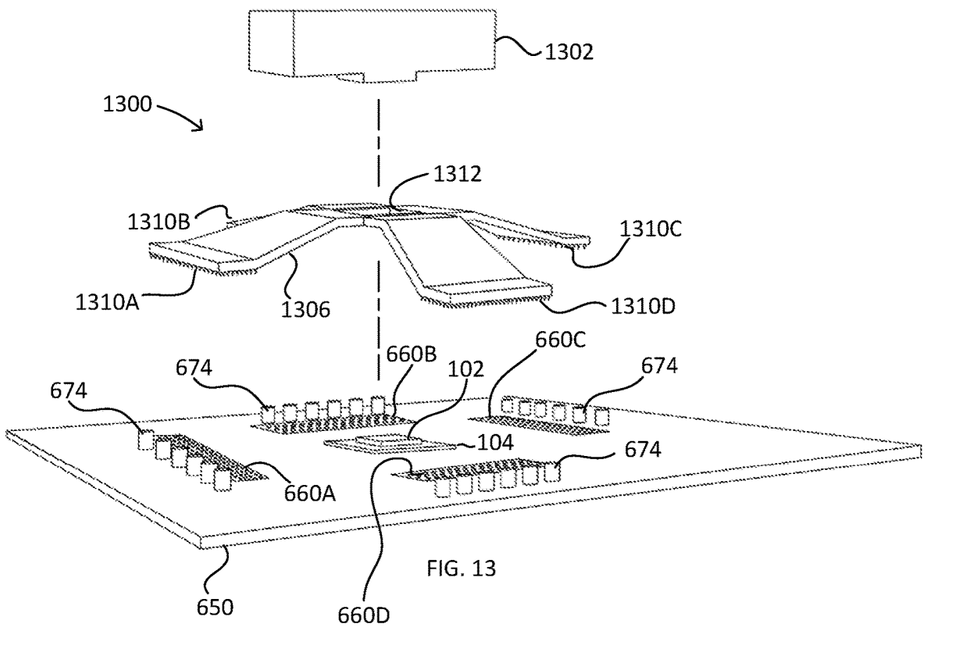
FIG. 13 is an exploded perspective view illustrating any of the arrangements of FIGS. 1-8 together with a third example metal plate and cooler in accordance with embodiments.
Figure 14:
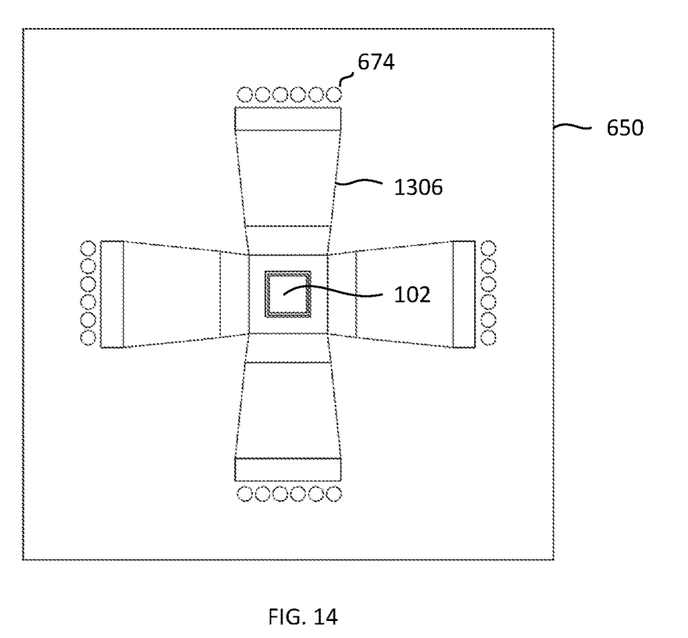
FIG. 14 is a plan view of the arrangement of FIG. 13 with the cooler omitted for clarity of illustration.

Metal plate 906 may take a wide variety of forms in other embodiments. For example, FIGS. 13 and 14 illustrate a system 1300 in which semiconductor assembly substrate 104 has a rectangular shape (including, potentially, a square shape), and PCB ground contacts 660 are disposed in four locations 660A, 660B, 660C, 660D adjacent to each of the four sides of substrate 104. Metal plate 1306 includes electrical contacts at corresponding locations 1310A, 1310B, 1310C, 1310D such that, when mounted to PCB 650, plate 1306 is electrically connected to all of PCB ground contacts 660a, 660B, 660C, 660D as well as to substrate contact(s) 114 on the top of substrate 104. As in the embodiments illustrated in FIGS. 9-12, system 1300 may include a cooler 1302 that extends through an opening 1312 in plate 1306 such that it contacts the upward facing side of die 102. In FIG. 14, cooler 1302 has been omitted for clarity of illustration.

System 1300 may also be implemented using a plate and cooler arrangement such as that shown in FIG. 12, in which opening 1312 is not present and thermal communication between the die and the cooler is through the metal plate. In still other embodiments, different shapes, orientations and mounting arrangements may be used for the metal plate, including, for example, placement of the plate diagonally over semiconductor assembly 100. Moreover, a variety of different materials may be used to construct the metal plate. In some embodiments, copper may be used because of its favorable characteristics as both an electrical and a thermal conductor.

Multiple specific embodiments have been described above and in the appended claims. Such embodiments have been provided by way of example and illustration. Persons having skill in the art and having reference to this disclosure will perceive various utilitarian combinations, modifications and generalizations of the features and characteristics of the embodiments so described. For example, steps in methods described herein may generally be performed in any order, and some steps may be omitted, while other steps may be added, except where the context clearly indicates otherwise. Similarly, components in structures described herein may be arranged in different positions or locations, and some components may be omitted, while other components may be added, except where the context clearly indicates otherwise. The scope of the disclosure is intended to include all such combinations, modifications, and generalizations as well as their equivalents.

What is claimed is:

1. A semiconductor assembly, comprising:
a substrate having top and bottom sides, the bottom side configured to face a printed circuit board ("PCB"), wherein the substrate comprises a material that is not electrically conductive, such that the top and bottom sides of the substrate are not electrically conductive;
an integrated circuit die coupled to the substrate such that it covers a second region but not a first region of the top side of the substrate, the die comprising first and second distinct sets of ground pads;
at least a first electrically conductive element located in the first region on the top side of the substrate and electrically connected to the ground pads in the first set by a first ground path;
at least a second electrically conductive element located on the bottom side of the substrate and electrically connected to the ground pads in the second set by a second ground path disposed inside the substrate;
wherein the first and second ground paths are not electrically connected to one another inside the substrate;
a PCB coupled to the substrate such that the bottom side of the substrate faces the PCB and such that the substrate covers a second region but not a first region of the PCB, the first and second regions of the PCB comprising first and second PCB ground contacts, respectively;
at least a first electrically conductive path between the first PCB ground contact and the first electrically conductive element on the top side of the substrate; and
at least a second electrically conductive path between the second PCB ground contact and the second electrically conductive element on the bottom side of the substrate.

2. A semiconductor assembly according to claim 1, wherein:
the first electrically conductive path comprises a metal plate that extends over at least part of the first region of the substrate and at least part of the first region of the PCB.

3. A semiconductor assembly according to claim 2, wherein:
the metal plate defines an opening that exposes an upward facing side of the die.

4. A semiconductor assembly according to claim 3, further comprising:
a cooler configured to be mounted over the opening such that a thermally conductive path is established through the opening between the cooler and the upward facing side of the die.

5. A semiconductor assembly according to claim 2, wherein:
the die has upward and downward facing sides such that the downward facing side is coupled to the substrate; and
the metal plate covers substantially all of the upward facing side of the die and is in thermal communication therewith.

6. A semiconductor assembly according to claim 5, further comprising:
a cooler configured to be mounted over the metal plate such that a thermally conductive path is established, through the metal plate, between the cooler and the upward facing side of the die.

7. A semiconductor assembly according to claim 2:
wherein the metal plate is electrically connected to the first electrically conductive element on the top side of the substrate by a plurality of electrically conductive pins.

8. A semiconductor assembly according to claim 2, wherein:
the first PCB ground contact is disposed in first and second locations on the PCB adjacent opposite ends of the substrate; and
the metal plate is electrically connected to the first PCB ground contact at both of the first and the second locations.

9. A semiconductor assembly according to claim 2, wherein:
the substrate has a rectangular shape;
the first PCB ground contact is disposed in first, second, third and fourth locations on the PCB adjacent, respectively, to each of the four sides of the substrate; and
the metal plate is electrically connected to the first PCB ground contact at each of the first, second, third and fourth locations.

10. A semiconductor assembly according to claim 1, wherein:
the first and second sets of ground pads are associated, respectively, with first and second circuitry in the die, wherein the first circuitry is configured to operate with smaller current change per unit time than is the second circuitry; and
the first electrically conductive path is longer than the second electrically conductive path.

11. A semiconductor assembly according to claim 1, wherein:
the first and second sets of ground pads are associated, respectively, with first and second circuitry in the die, wherein the first circuitry is configured to operate with smaller current change per unit time than is the second circuitry; and
off-chip decoupling capacitors associated with ground pads in the first set are located farther from the die than are off-chip decoupling capacitors associated with ground pads in the second set.

12. A semiconductor assembly according to claim 1, wherein:
the die is coupled to the substrate in flip chip fashion; and
the first and second ground paths are both inside the substrate.

13. A semiconductor assembly according to claim 1, wherein:
the substrate has a rectangular shape; and
the first electrically conductive element is disposed adjacent to each of the four sides of the substrate.

14. A semiconductor assembly according to claim 13, wherein:
the first electrically conductive element comprises a continuous region of exposed metal extending around the circumference of the die on the top side of the substrate.

15. A semiconductor assembly, comprising:
a substrate having top and bottom sides, the bottom side configured to face a printed circuit board ("PCB"), wherein the substrate comprises a material that is not electrically conductive, such that the top and bottom sides of the substrate are not electrically conductive;
an integrated circuit die coupled to the substrate such that it covers a second region but not a first region of the top side of the substrate, the die comprising first and second distinct sets of ground pads;
at least a first electrically conductive element located in the first region on the top side of the substrate and electrically connected to the ground pads in the first set by a first ground path; and
at least a second electrically conductive element located on the bottom side of the substrate and electrically connected to the ground pads in the second set by a second ground path disposed inside the substrate;
wherein the first and second ground paths are not electrically connected to one another inside the substrate;
wherein the substrate has a rectangular shape; and
wherein the first electrically conductive element is disposed adjacent to each of the four sides of the substrate.

16. A semiconductor assembly according to claim 15, further comprising;
a PCB coupled to the substrate such that the bottom side of the substrate faces the PCB and such that the substrate covers a second region but not a first region of the PCB, the first and second regions of the PCB comprising first and second PCB ground contacts, respectively;
at least a first electrically conductive path between the first PCB ground contact and the first electrically conductive element on the top side of the substrate; and
at least a second electrically conductive path between the second PCB ground contact and the second electrically conductive element on the bottom side of the substrate.

17. A semiconductor assembly according to claim 16, wherein:
the first electrically conductive path comprises a metal plate that extends over at least part of the first region of the substrate and at least part of the first region of the PCB.

18. A semiconductor assembly according to claim 17, wherein:
the metal plate defines an opening that exposes an upward facing side of the die.

19. A semiconductor assembly according to claim 18, further comprising:
a cooler configured to be mounted over the opening such that a thermally conductive path is established through the opening between the cooler and the upward facing side of the die.

20. A semiconductor assembly according to claim 17, wherein:
the die has upward and downward facing sides such that the downward facing side is coupled to the substrate; and
the metal plate covers substantially all of the upward facing side of the die and is in thermal communication therewith.

21. A semiconductor assembly according to claim 20, further comprising:
a cooler configured to be mounted over the metal plate such that a thermally conductive path is established, through the metal plate, between the cooler and the upward facing side of the die.

22. A semiconductor assembly according to claim 17:
wherein the metal plate is electrically connected to the first electrically conductive element on the top side of the substrate by a plurality of electrically conductive pins.

23. A semiconductor assembly according to claim 17, wherein:
the first PCB ground contact is disposed in first and second locations on the PCB adjacent opposite ends of the substrate; and
the metal plate is electrically connected to the first PCB ground contact at both of the first and the second locations.

24. A semiconductor assembly according to claim 17, wherein:
the substrate has a rectangular shape;
the first PCB ground contact is disposed in first, second, third and fourth locations on the PCB adjacent, respectively, to each of the four sides of the substrate; and
the metal plate is electrically connected to the first PCB ground contact at each of the first, second, third and fourth locations.

25. A semiconductor assembly according to claim 16, wherein:
the first and second sets of ground pads are associated, respectively, with first and second circuitry in the die, wherein the first circuitry is configured to operate with smaller current change per unit time than is the second circuitry; and
the first electrically conductive path is longer than the second electrically conductive path.

26. A semiconductor assembly according to claim 16, wherein:
the first and second sets of ground pads are associated, respectively, with first and second circuitry in the die, wherein the first circuitry is configured to operate with smaller current change per unit time than is the second circuitry; and
off-chip decoupling capacitors associated with ground pads in the first set are located farther from the die than are off-chip decoupling capacitors associated with ground pads in the second set.

27. A semiconductor assembly according to claim 15, wherein:
the die is coupled to the substrate in flip chip fashion; and
the first and second ground paths are both inside the substrate.

28. A semiconductor assembly according to claim 15, wherein:
the first electrically conductive element comprises a continuous region of exposed metal extending around the circumference of the die on the top side of the substrate.

* * * * *